United States Patent
Arimoto et al.

(10) Patent No.: US 6,573,613 B2
(45) Date of Patent: Jun. 3, 2003

(54) SEMICONDUCTOR MEMORY DEVICE HAVING CELL PLATE ELECTRODES ALLOWING INDEPENDENT POWER SUPPLY FOR EACH REDUNDANT REPLACEMENT UNIT

(75) Inventors: Kazutami Arimoto, Hyogo (JP); Hiroki Shimano, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/118,433

(22) Filed: Apr. 9, 2002

(65) Prior Publication Data
US 2003/0015735 A1 Jan. 23, 2003

(30) Foreign Application Priority Data
Jul. 18, 2001 (JP) ........................ 2001-217671

(51) Int. Cl.[7] ................ H01L 27/108; H01L 29/76; H01L 29/94; H01L 31/119
(52) U.S. Cl. ................ 257/908; 257/296; 257/298; 257/300
(58) Field of Search ................ 257/213, 288, 257/296, 298, 300, 307, 908, 311; 365/154, 156, 174, 189.05, 189.11, 205, 51, 230.03, 190, 149; 711/105, 111; 324/212

(56) References Cited

U.S. PATENT DOCUMENTS

| | | | | |
|---|---|---|---|---|
| 5,381,373 A | * | 1/1995 | Ohsawa | 365/201 |
| 5,661,678 A | * | 8/1997 | Yoshida et al. | 365/149 |
| 6,272,054 B1 | * | 8/2001 | Barth et al. | 365/189.06 |
| 6,307,251 B1 | * | 10/2001 | Sekikawa et al. | 257/532 |
| 6,344,990 B1 | * | 2/2002 | Matsumiya et al. | 365/63 |

FOREIGN PATENT DOCUMENTS

| | | |
|---|---|---|
| JP | 10-208497 | 8/1998 |
| JP | 11-25688 | 1/1999 |

* cited by examiner

*Primary Examiner*—Nathan J. Flynn
*Assistant Examiner*—Victor A. Mandala, Jr.
(74) *Attorney, Agent, or Firm*—McDermott, Will & Emery (57) ABSTRACT

A word line and a cell plate electrode line are formed at a common interconnection layer. A redundant replacement unit for a faulty row is set corresponding to the cell plate electrode line. For each redundant replacement unit, a program element is arranged for stopping supply of a cell plate voltage from the cell plate voltage line to the cell plate electrode line. The program element corresponding to the cell plate electrode line short-circuited to the word line nonvolatilely changes from the on state to the off state in response to an externally supplied input instruction.

10 Claims, 5 Drawing Sheets

SEMICONDUCTOR MEMORY DEVICE HAVING CELL PLATE ELECTRODES ALLOWING INDEPENDENT POWER SUPPLY FOR EACH REDUNDANT REPLACEMENT UNIT

BACKGROUND OF THE INVENTION

1. Field of the Invention

The present invention relates to a semiconductor memory device, and particularly relates to a semiconductor memory device having memory cells for storing data in capacitors as well as redundant memory cells to be used for replacing a defective memory cell.

2. Description of the Background Art

In a field of data processing and others, circuit devices, which are referred to as "system LSIs (Large Scale Integrated Circuits)" have been widely used for fast data processing with low power consumption. In the system LSI, a logic such as a processor and a memory device are integrated on a common semiconductor chip. Since the logic and the memory device are mutually connected via on-chip interconnections, the system LSI can achieve the following advantages. (1) A load on a signal interconnection is smaller than that on an on-board interconnection so that data/signal can be transmitted fast. (2) Since there is no restriction on the number of pins, data bits can be increased in number so that a band width of data transfer can be increased. (3) Since respective components are integrated on the semiconductor chip to a higher extent than a structure, in which elements are individually arranged on a board, a system scale can be small, and the size and weight of the system can be small. (4) Since macros contained in library can be arranged as components to be formed on the semiconductor ship, this improves the design efficiency.

For the reasons described above, the system LSIs have been widely used in various fields, and memories such as DRAMs (Dynamic Random Access Memories), SRAMs (Static Random Access Memories) and flash EEPROMs (Electrically Erasable and Programmable Read Only Memories) are used as the integrated memory devices. Also, the logics are formed of processors performing control and processing, analog processing circuits such as A/D converter circuits, and/or dedicated logic circuits performing logical processing.

For integrating the processor and memory device in the system LSI, it is necessary to form the logic and the memory device in the same manufacturing steps as far as possible for reducing the number of manufacturing steps and therefore the cost. The DRAM stores data taking the form of electric charges in the capacitor. The capacitor has electrodes, which are referred to as a cell plate electrode and a storage node electrode, respectively, and are located at an upper portion of a semiconductor substrate region.

The above capacitor structure has a complicated form such as a hollow and cylindrical form for providing a large capacitance with a small occupied area. Accordingly, even if a DRAM-logic merging process for forming the DRAM and the logic in the same manufacturing process is employed, and the transistors of the logic and the transistors of the DRAM are formed in the same manufacturing step, it is necessary to provide a step of forming the capacitor of the DRAM, and it is also necessary to provide a flattening process for reducing a difference in level, which is formed between the DRAM and the logic due to a three-dimensional structure of the capacitor of the DRAM or between the DRAM memory array and its peripheral portion. Consequently, the manufacturing steps increase significantly in number, which increases the chip cost.

In an SRAM, each memory cell is formed of four transistors and two load elements. These load elements are usually formed of MOS transistors (insulated gate field-effect transistors), and do not employ a capacitor or the like. Therefore, the SRAM can be formed in a complete CMOS logic process. Thus, the SRAM and the logic can be formed in the same manufacturing process. The SRAMs have been used as cache memories, register file memories and others for the processors because they can operate fast.

In the SRAM, the memory cell is formed of a flip-flop circuit, and keeps data as long as it is supplied with a power supply voltage. Therefore, the SRAM does not require refreshing for holding the data in contrast to the DRAM. In the portable information terminals or the like, therefore, the SRAMs have been widely used as main memories for simplifying the system structures because the SRAM does not require complicated memory control for refreshing, which is essential in the DRAM, and can be controlled more simply than the DRAM.

Even in the portable information terminals, however, it is now necessary to handle large amounts of data such as audio data and/or image data as a result of recent improvement of functions, and therefore memories of large storage capacities are required.

Owing to development of fine work process, the memory size of the DRAM has been shrunk, and a cell size of 0.3 square micrometers has been achieved in a 0.18-$\mu$m DRAM process. In the SRAM, a full CMOS memory cell is formed of six MOS transistors including two P-channel MOS transistors and four N-channel MOS transistors.

Accordingly, even if the shrinking process has been developed, it is necessary to separate an N-well for forming the P-channel MOS transistor in the memory cell from a P-well for forming the N-channel MOS transistor. Due to the restrictions on the separation distance between the wells and others, the memory size of the SRAM has been shrunk only to a smaller extent than the DRAM. For example, the memory size of the SRAM in the 0.18-$\mu$m CMOS logic process is substantially equal to 7 square micrometers, and thus is larger by 20 times than the memory size of the DRAM.

Accordingly, in the case of utilizing the SRAM as the main memory of a large storage capacity, the chip size significantly increases, and therefore it is extremely difficult to arrange the SRAM of the storage capacity of 4 Mbits or more together with the logic in the system LSI having a restricted chip area.

SUMMARY OF THE INVENTION

Accordingly, an object of the invention is to provide a semiconductor memory device, in which a large storage capacity can be achieved with a small occupied area without significantly increasing the number of manufacturing steps, and particularly a structure for suppressing wasteful power consumption.

A semiconductor memory device according to the invention includes a plurality of memory cells arranged in rows and columns, and each including a capacitor having a cell plate electrode receiving a reference voltage and a storage electrode for accumulating charges corresponding to storage information; a plurality of word lines arranged corresponding to the plurality of rows of the memory cells, respectively, and each connected to the memory cells in the corresponding row; a row select circuit for setting each of the plurality of word lines to one of voltages corresponding to an active state and an inactive state, respectively, in accordance with an address signal; a plurality of bit lines arranged corresponding to the plurality of columns of the memory cells, respectively, and each connected to the memory cells in the corresponding column; a plurality of cell plate electrode lines formed at the same interconnection layer as the plurality of word lines, and each arranged for a predetermined number of rows for being commonly used as the cell plate electrode by the plurality of memory cells corresponding to a predetermined number of rows; a cell plate voltage line for supplying the reference voltage; and a plurality of power-off control portions each arranged for the cell plate electrode lines of N (N: natural number) in number corresponding to a redundant replacement unit for a faulty row for stopping supply of the reference voltage from the cell plate voltage line to the corresponding N cell plate electrode lines in accordance with an instruction.

Preferably, each of the power-off control portions includes a program element electrically coupled between the cell plate voltage line and the corresponding N cell plate electrode lines. The program element nonvolatilely changes from an on state to an off state in response to the instruction supplied when the corresponding redundant replacement unit contains the faulty row.

In the above structure, the program element is formed of a fuse element.

Preferably, N is equal to one, and the redundant replacement unit is formed of at least one row corresponding to the same cell plate electrode line.

In the semiconductor memory device described above, the redundant replacement unit for the faulty row is set corresponding to the cell plate electrode line, and the supply of the reference voltage (cell plate voltage) to the cell plate electrode line can be stopped for each redundant replacement unit for the faulty line. As a result, the cell plate electrode line and the word line are formed at the same interconnection layer so that the manufacturing steps can be simple. Also, a large storage capacity can be achieved with a small occupied area. Further, manufacturing yield can be stably kept by redundant repair. At the same time, it is possible to avoid increase in current consumption due to short-circuit between the cell plate electrode line and the word line.

Preferably, the plurality of word lines include sub-word lines arranged for the rows, respectively, and main word lines each provided for the rows of M (M: integer larger than one) in number and arranged hierarchically with respect to the sub-word line. The rows corresponding to the cell plate electrode lines of N in number belonging to the same redundant replacement unit are related to the same main word line.

As a result, the power-off control portions can be efficiently reduced in number in the hierarchical word line structure.

Alternatively, each of the power-off control portions may preferably include a latch circuit for holding a control signal indicating whether the corresponding redundant replacement unit contains the faulty row or not, and a first power supply switch electrically coupled between the cell plate voltage line and the corresponding N cell plate electrode lines for being turned on/off in response to the control signal held in the latch circuit.

According to the above structure, it is not necessary to arrange, for each cell plate electrode line, a program element for cutting off the power.

Further, each of the power-off control portions may preferably include a second power supply switch electrically coupled between the voltage corresponding to the inactive state of each word line and the N cell plate electrode lines for being turned on complementarily with the first power supply switch in response to the control signal held in the latch circuit.

Thereby, it is possible to prevent further reliably the occurrence of a leak current from a short-circuited path between the cell plate electrode line and the word line.

Preferably, the semiconductor memory device further includes an address determining circuit for storing a faulty address indicating the redundant replacement unit including the faulty row, and successively producing the control signal for each of the redundant replacement units based on comparison between each of the successively renewed address signals and the faulty address. Each of the power-off control portions further includes a gate circuit for transmitting the control signal received from the address determining circuit to the latch circuit when the successively renewed address signal indicates the corresponding redundant replacement unit. The latch circuit holds the control signal transmitted by the gate circuit during the power-on state.

As a result, the address determining circuit, which is required for redundant replacement repair, can be commonly used when executing the power supply control for the cell plate electrode lines. For a predetermined period starting from the power-on, it is determined whether each of the cell plate electrode lines is to be replaced or not, and the power supply to the cell plate electrode line is fixedly executed during a subsequent power-on period. Therefore, no adverse effect is exerted on the normal memory operation.

Preferably, the cell plate voltage line includes a plurality of interconnections capable of externally receiving independent voltages, respectively, during an operation test.

Alternatively, the cell plate voltage line may include two interconnections capable of externally receiving independent voltages, respectively, during an operation test. The neighboring two lines among the plurality of cell plate voltage lines are connected to the two interconnections via the corresponding power-off control portions.

According to the above structure, a burn-in test can be effectively executed for screening a faulty portion hiding in an insulating film located between the cell plate electrode line and the word line, which are formed at the same interconnection layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numerals or characters.

First Embodiment

Figure 1:
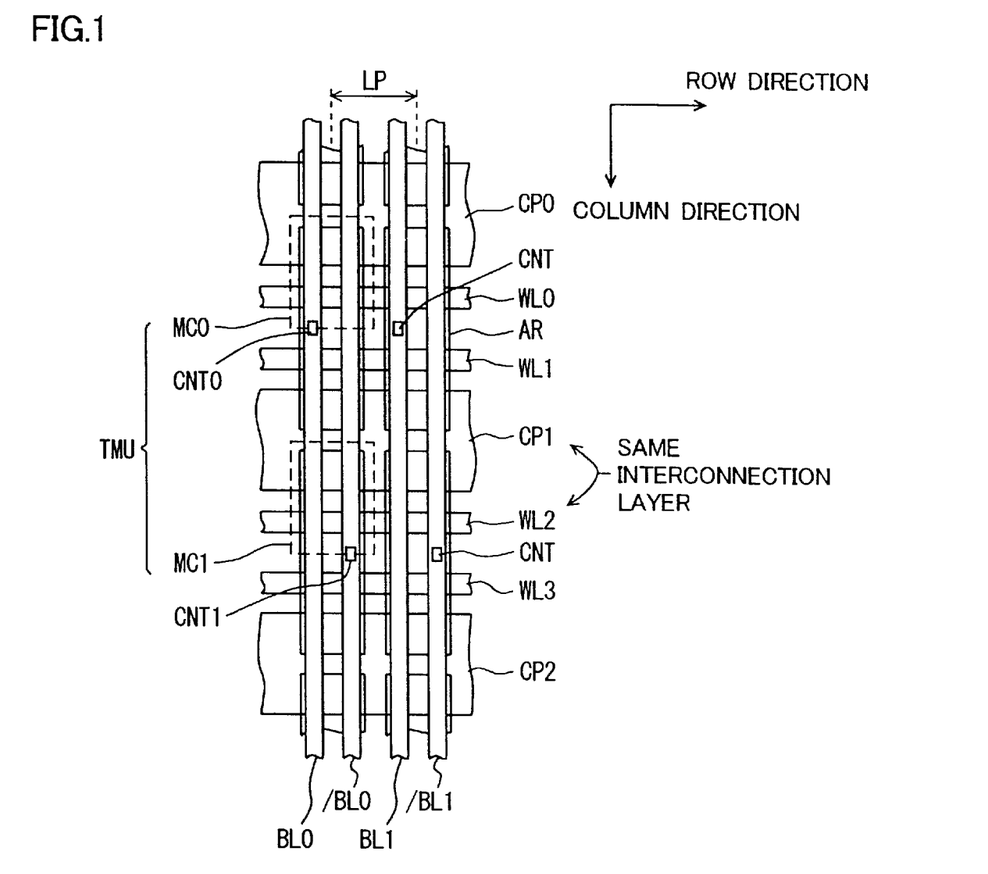
FIG. 1 schematically shows a structure of an array of a semiconductor memory device according to a first embodiment of the invention.

FIG. 1 schematically shows a structure of an array of a semiconductor memory device according to a first embodiment of the invention. FIG. 1 shows a typical layout of memory cells arranged in four rows and two columns.

Referring to FIG. 1, word lines WL0–WL3 extend in the row direction. Word lines WL0–WL3 are arranged corresponding to the memory cell rows, respectively, and each are connected to the memory cells in the corresponding row.

Cell plate electrode lines CP0–CP2 are arranged parallel to word lines WL0–WL3, and are formed at the same interconnection layer as these word lines.

In the memory cell array, therefore, each of cell plate electrode lines CP0–CP2 extending in the row direction is arranged for the two word lines (i.e., for the two memory cell rows), and the cell plate electrode lines neighboring to each other in the column direction are isolated from each other by word line WL located therebetween.

Each cell plate electrode line is supplied with a constant reference voltage (cell plate voltage VCP).

In the column direction, active regions AR for forming the memory cells are aligned at predetermined intervals. In each active region AR, two memory cells are formed. This active region AR crosses with the two neighboring word lines, and has a portion overlapping with the cell plate electrode in a plan.

Bit lines BL0 and /BL0, and BL1 and /BL1 aligned to active regions AR are arranged in the column direction.

A contact CNT for connecting the active region to the bit line is arranged between the neighboring word lines (WL0 and WL1, or WL2 and WL3). In FIG. 1, a contact CNT0 connects the active region of memory cell MC0 to bit line BL0, and a contact CNT1 connects the active region forming memory cell MC1 to bit line /BL0.

These memory cells MC (MC0 and MC1) have the structures of the DRAM cells, as will be described later in greater detail. Memory cells MC0 and MC1 operate to store data of 1 bit. This set of the memory cells storing data of one bit will be referred to as a "twin cell unit TMU", hereinafter.

The two bit lines are arranged within a pitch (arrangement interval) LP of the memory cells in the row direction. The memory cell pitch represents a distance between center lines of the active regions, which form the memory cells neighboring to each other in the row direction, respectively.

In the following description, reference characters "CP" generally indicate the cell plate electrode lines. Also, reference characters "WL", "BL" (or "/BL") and "MC" generally indicate the word lines, bit lines and memory, respectively. For representing the specific cell plate electrode line, word line, bit line and memory cell, numbers are suffixed to the reference characters, and thus reference characters such as "CP0", "WL0", "BL0" (or "/BL0") or "MC0" are used.

According to the arrangement of the memory cells shown in FIG. 1, active regions AR are arranged in each row and each column, and the memory cell is arranged corresponding to each crossing portion between the row and column. This arrangement of the memory cells is "highest density cell arrangement", and is usually used in the open bit line structure having low noise immunity. As shown in FIG. 1, however, the two bit lines are arranged within a region corresponding to memory cell pitch LP, whereby a "folded bit line structure" having high noise immunity can be employed in the "highest density cell arrangement". Thus, the two word lines (e.g., word lines WL0 and WL2), which neighbor to each other with one word line therebetween, are simultaneously selected so that complementary data is read onto bit lines BL0 and /BL0, and the data stored in twin-cell unit TMU can be read out by differentially amplifying the complementary data thus read.

Figure 2:
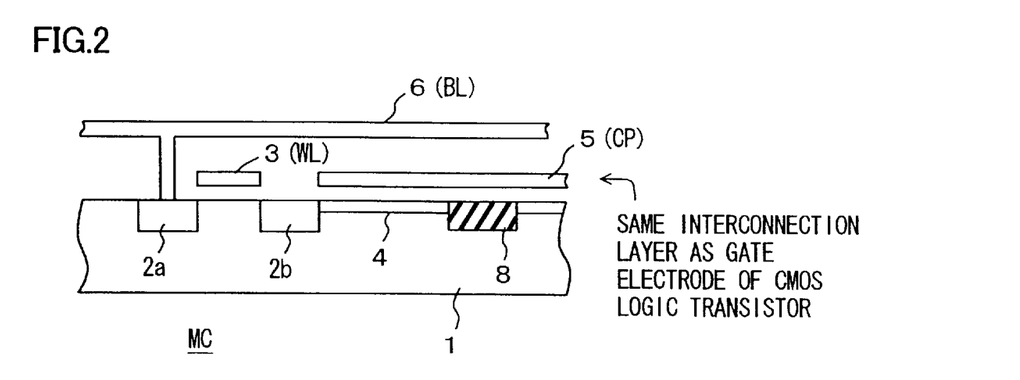
FIG. 2 schematically shows a sectional structure of a memory cell arranged as shown in FIG. 1.

FIG. 2 schematically shows a sectional structure of the memory cell arranged as shown in FIG. 1. In FIG. 2, memory cell MC includes impurity regions 2a and 2b formed at the surface of a semiconductor substrate region 1 with a space therebetween, a conductive layer 3 which is formed on the surface of the region between impurity regions 2a and 2b with a gate insulating film (not shown) therebetween, a storage node region 4 electrically coupled to impurity region 2b, a conductive layer 5 opposed to storage node region 4 and a conductive layer 6 electrically connected to impurity region 2a.

Conductive layer 3 forms word line WL. Also, conductive layer 5 forms cell plate electrode line CP, and conductive layer 6 forms bit line BL. Conductive layer 5 forming the cell plate electrode is opposed to the storage node electrode region of the neighboring memory cell with an element isolating region 8 therebetween. Storage node region 4 may be merely an inversion layer formed at the surface of semiconductor substrate region 1, and also may be an impurity region doped with impurities and having a surface, on which an inversion layer is formed.

The element isolating film formed in element isolating region 8 has a surface, which is flattened, e.g., by CMP (Chemical Mechanical Polishing) process and is substantially flush with the surface of the substrate region, so that a level difference of the stepped portion in the DRAM is minimized.

Conductive layers 3 and 5 are made of a material containing silicon such as doped polycrystalline silicon, polycide such as tungsten silicide (WSix) or cobalt silicide (CoSix), or salicide (self-aligned silicide). Conductive layers 3 and 5 are formed at the same interconnection layer. These conductive layers 3 and 5 are formed at the same interconnection layer as the gate electrode of the transistors in the CMOS logic process (i.e., the transistors of the logic and the peripheral transistors of the storage device). The fact that the layers are formed at the same interconnection layer means that the layers are manufactured in the same producing steps.

A gate insulating film and a capacitor insulating film are formed under conductive layers 3 and 5, respectively. These gate insulating film and the capacitor insulating film may be the same insulating film formed in the same manufacturing process. Dual gate oxide film process may be employed to provide these gate insulating film and the capacitor insulating film, which are formed of oxide films having different thicknesses, respectively. The "dual gate oxide film process" is the process, in which two kinds of oxide films (insulating films) having different thicknesses are formed by selective etching of the oxide film.

Conductive layer 6 forming bit line BL is made of a first metal interconnection layer and others, and is arranged over cell plate electrode line CP so that a so-called CUB (Capacitor Under Bit line) structure is achieved.

The capacitor of the memory cell has a planar capacitor structure, in which the storage node electrode is formed of, e.g., a diffusion layer at the surface of semiconductor substrate region 1 or an inversion layer formed at the surface of semiconductor substrate region 1, and the cell plate electrode extends parallel to the word line. Therefore, the cell plate electrode line and the word line are formed at the same interconnection layer and in the same manufacturing process so that it is not necessary to prepare an additional interconnection layer for the cell plate electrode and the storage node, and the manufacturing steps can be simple.

Owing to the planar capacitor structure, a difference in height level does not occur between the memory array and the peripheral circuit, and it is not necessary to employ the flattening process such as CMP process for reducing the level difference. Accordingly, the memory array can be formed substantially in the CMOS logic process, and thus can be formed in the same manufacturing steps as the transistors of the logic.

For example, when a row active command instructing the row selection is applied in the operation of selecting the memory cell row, a bit (RA<1>) at the second lowest position in the row address is degenerated so that the paired word lines (sub-word lines) located on the opposite sides of another word (sub-word) line are simultaneously selected in FIG. 1. For example, when word lines WL0 and WL2 are simultaneously selected, memory cells MC0 and MC1 are connected to bit lines BL0 and /BL0, respectively.

A sense amplifier circuit (not shown) is arranged corresponding to each bit line pair for differentially amplifying the voltages on the corresponding bit line pair. Therefore, memory cells MC0 and MC1 store the complementary data, i.e., data at H-level and data at L-level, respectively, so that twin cell unit MU stores the information of one bit.

Figure 3:
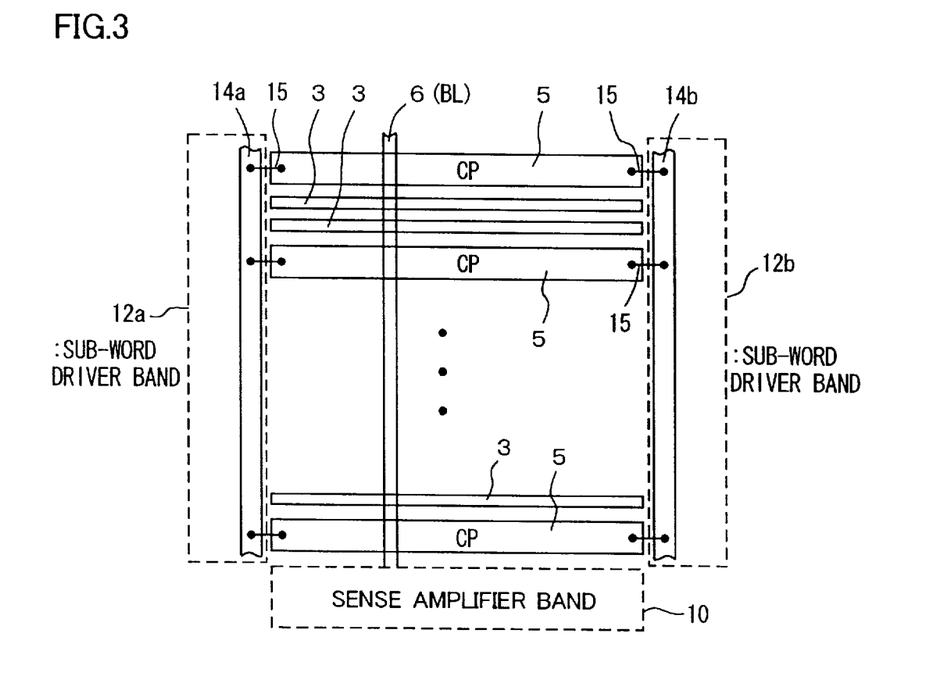
FIG. 3 schematically shows an arrangement of cell plate electrode lines in the first embodiment of the invention.

FIG. 3 schematically shows an arrangement of the cell plate electrode lines in the first embodiment of the invention. More specifically, FIG. 3 shows the arrangement of the cell plate electrode lines for one memory sub-array, which forms one arrangement unit of the sub-word lines in the hierarchical word line structure.

Referring to FIG. 3, conductive layers 5 forming cell plate electrode lines CP and conductive layers 3 forming the word (sub-word) lines extend parallel to each other and in the row direction, and are arranged at the same interconnection layer. On the opposite sides of the memory sub-array, sub-word line driver bands 12a and 12b including the sub-word line drivers for driving the word lines (sub-word lines) are arranged. It is now assumed that the word lines form the hierarchical word line structure including the main word lines and the sub-word lines. In the following description, the sub-word line may be simply referred to as the "word line".

Conductive lines 14a and 14b, which are formed, e.g., from the same first metal interconnection as conductive layer 6 forming bit line BL, are formed in sub-word line driver bands 12a and 12b, respectively. Each of conductive lines 14a and 14b is connected to cell plate electrode conductive layer 5 via a contact 15. Conductive layer 6 forming bit line BL is coupled to a sense amplifier included in sense amplifier band 10.

Since conductive lines 14a and 14b transmitting the cell plate voltage are arranged in sub-word line driver bands 12a and 12b, respectively, the cell plate voltage at the required voltage level can be stably supplied even in such a structure that cell plate electrode lines CP in the memory sub-array is divided in the column direction. In the following description, conductive lines 14a and 14b transmitting the cell plate voltage may be generally referred to as cell plate voltage lines 14.

In the conventional DRAM, therefore, the cell plate electrodes for each memory sub-array are formed of a single plate-like electrode covering the whole structure. In the semiconductor memory device according to the invention, however, the cell plate electrodes are formed of the cell plate electrode lines, which are formed at the interconnection layer, and each are commonly used by the memory cell group belonging to the corresponding two memory cell rows.

Owing to the above structure, the manufacturing process step dedicated to the manufacturing of the cell plate electrode layer is not required. Further, a difference in height level between the memory array and the peripheral circuit does not occur so that the process step for reducing the level difference is not required. Therefore, the memory cell array can be formed substantially in accordance with the CMOS process, and therefore, the memory array can be formed in the same manufacturing process as the logic transistors.

Figure 4:
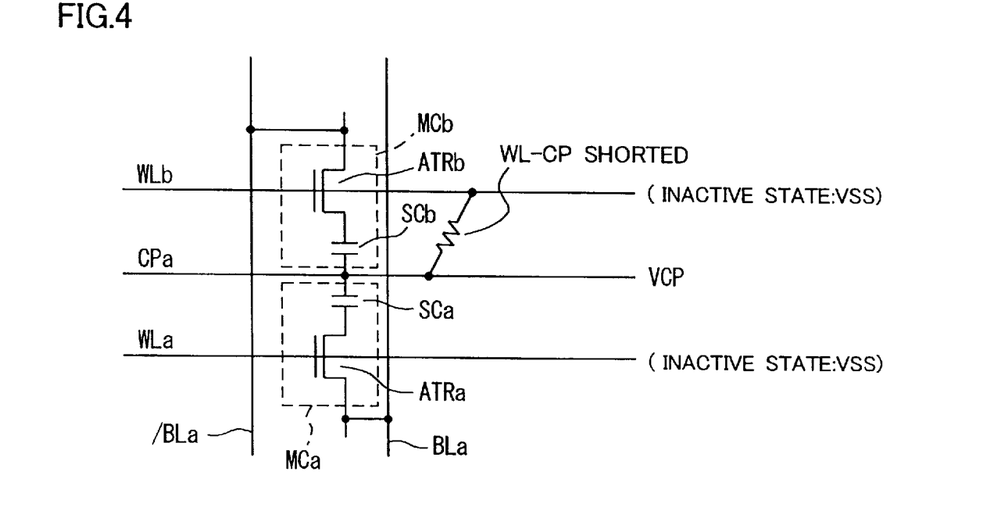
FIG. 4 schematically shows a problem due to short-circuit between a word line and the cell plate electrode line.

Then, description will now be given on the short-circuit between the word line and the cell plate electrode line. FIG. 4 shows a typical example of a structure, in which memory cells MCa and MCb commonly use the single cell plate electrode line.

Referring to FIG. 4, memory cell MCa has an access transistor ARTa and a capacitor SCa. Access transistor ARTa is electrically connected between the storage node of capacitor SCa and bit line BLa, and has a gate coupled to word line WLa. The cell plate electrode of capacitor SCa corresponds to cell plate electrode line CPa.

Memory cell MCb has an access transistor ATRb and a capacitor SCb. Access transistor ATRb is electrically coupled between the storage node of capacitor SCb and bit line /BLa, and has a gate coupled to word line WLb. The cell plate electrode line CPa is shared by the memory cell MCa and MCb, that is, the cell plate electrode of capacitor SCb corresponds to cell plate line CPa.

In the conventional DRAM cell structure produced by the embedded-DRAM process, which allows use of two or three interconnection layers, the word line and the cell plate electrode are formed at different interconnection layers, respectively, so that a process fault causing short-circuit between the word line and the cell plate electrode does no occur.

According to the semiconductor memory device of the invention, however, the word line and the cell plate electrode line are formed at the same interconnection layer as shown in FIG. 2. Therefore, a process fault causing short-circuit between them may occur.

Each cell plate electrode line CP is supplied with cell plate voltage VCP. Cell plate voltage VCP is set to a half of memory array voltage VCCS (i.e., VCCS/2) or the same level as memory array voltage VCCS. Word line WL is set to a high voltage VPP (VPP>VCCS) when it is active, and is set to 0 V and thus ground voltage VSS when it is inactive. Accordingly, when short-circuit occurs between word line WL and cell plate electrode line CP due to the process fault, a leak current flows between cell plate electrode line CP and word line WL.

In the faulty row corresponding to the word line, which is short-circuited as described above, the leak current adversely affects the corresponding memory cell to deteriorate the data holding properties. Therefore, such a faulty row is generally repaired a row at a time by replacing it with a redundant row, which is prepared in advance, and is formed of redundant memory cells (not shown).

However, even if the faulty row was repaired by replacement with the redundant row for correctly executing the data storage, the short-circuited path due to the faulty row physically remains. This steadily increases the current consumption in the DRAM. In particular, if many short-circuited paths are formed, leak currents steadily flow even in the standby mode so that it becomes difficult to satisfy the power consumption specification value, and a so-called standby current failure occurs.

Figure 5:
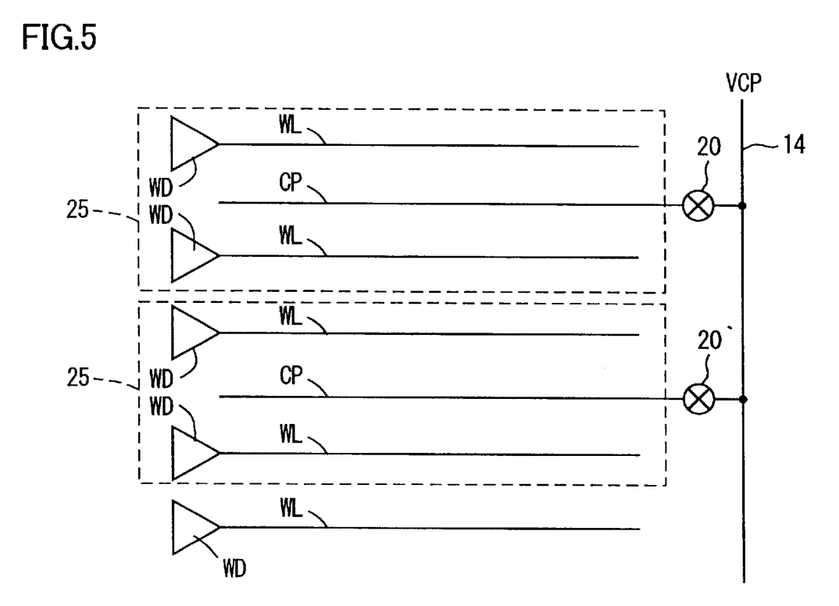
FIG. 5 schematically shows an example of a power supply structure for the cell plate electrode line in the first embodiment of the invention.

FIG. 5 shows an example of a power supply structure for the cell plate electrode lines in the first embodiment of the invention.

Referring to FIG. 5, a word line driver WD is provided corresponding to each word line WL, and is arranged, e.g., in a region corresponding to sub-word line driver bands 12a and 12b shown in FIG. 3. Each word line driver WD sets corresponding word line WL to one of the active state (high voltage VPP) and the inactive state (ground voltage VSS) in accordance with a result of row selection indicated by the address signal.

A program element 20 is electrically coupled between each cell plate electrode line CP and cell plate voltage line 14 supplying cell plate voltage VCP.

Program element 20 corresponding to cell plate electrode line CP, which is short-circuited to word line WL, is changed nonvolatilely from the on state to the off state in response to an externally applied instruction. Program element 20 in the off state stops supply of cell plate voltage VCP from cell plate voltage line 14 to corresponding cell plate electrode line CP. For example, program element 20 may be formed of a fuse element, which can be blown off by external laser blowing or high-voltage application.

Owing to the above structure, cell plate voltage VCP is not supplied to cell plate electrode line CP having the short-circuited path. Accordingly, a leak current does not flow through the short-circuited path even when the short-circuited path is formed between word line WL and cell plate electrode line CP due to the process fault.

In the structure shown in FIG. 5, each program element 20 is arranged for the two word lines to which corresponding two rows of memory cell cells shared one cell plate electrode line CP, and redundant replacement unit 25 is formed for the two word lines (two memory cell rows).

Figure 6:
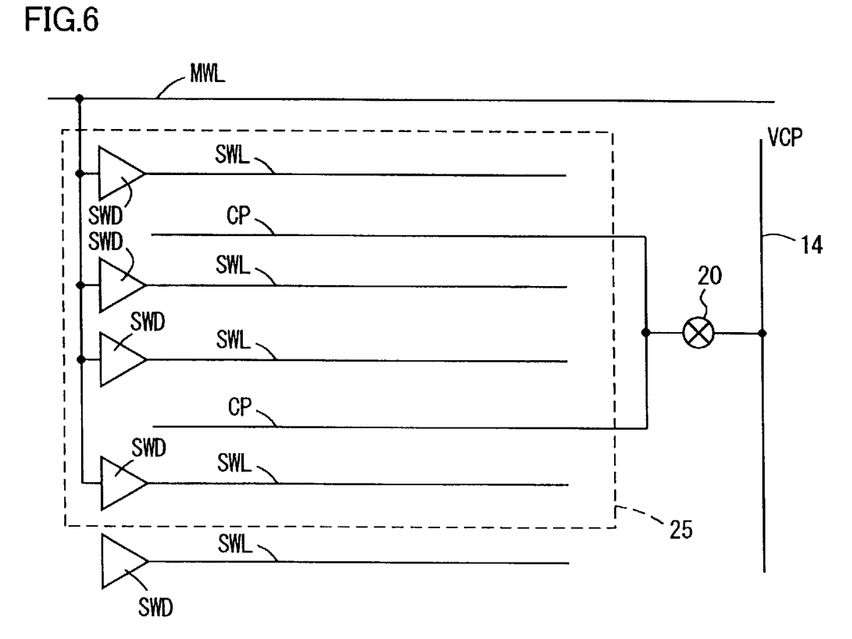
FIG. 6 schematically shows another example of the power supply structure for the cell plate electrode line in the first embodiment of the invention.

FIG. 6 shows another example of the power supply structure for the cell plate electrode line in the first embodiment of the invention.

Referring to FIG. 6, the word lines have the hierarchical word line structure including main word lines MWL and sub-word lines SWL. FIG. 6 shows a so-called 4-way hierarchical word line structure, in which four sub-word lines SWL correspond to one main word line MWL. One main word line MWL is arranged corresponding to the four memory cell rows. Sub-word line SWL is arranged corresponding to each memory cell row.

In this case, redundant replacement unit 25 for the faulty row may be set, e.g., for each main word line MWL. More specifically, program element 20 is arranged for two cell plate electrode lines CP corresponding to the same main word line MWL, and the four word lines (four memory cell rows) form each redundant replacement unit 25 for the faulty row. As compared with the structure shown in FIG. 5, therefore, the program elements can be reduced in number.

Program element 20 is electrically coupled between the two cell plate electrode lines CP corresponding to the same main word line MWL and cell plate voltage line 14. The program element corresponding to the redundant replacement unit, which contains a short-circuited word line (i.e., faulty word line), is nonvolatilely set to the off state, similarly to the case shown in FIG. 5.

According to the semiconductor memory device of the first embodiment, as described above, redundant replacement unit 25 for the faulty row is set corresponding to an integral multiple of the word line group (i.e., memory cell rows) to which corresponding multiple rows of memory cells shared one cell plate electrode line. Further, each program element, which is provided corresponding to each redundant replacement unit 25 for the faulty row, and is arranged between cell plate voltage line 14 and the cell plate electrode line CP, is set to the off state if the corresponding redundant replacement unit includes the faulty row.

Owing to the above structure, it is possible to provide the semiconductor memory device, which includes cell plate electrode line CP and word line WL formed at the same interconnection layer, requires only simple manufacturing steps and can achieve a large storage capacity with a small occupied area, and particularly the semiconductor memory device, which can ensure intended manufacturing yield owing to the redundant repair, and can avoid increase in current consumption due to the short-circuit between cell plate electrode line CP and word line WL. As a result, the power consumption can be reduced particularly in the standby mode.

Second Embodiment

In general, for executing the redundant repair by the redundant row, the faulty address indicating the redundant replacement unit containing the faulty row must be programmed in the semiconductor memory device. In a second embodiment, the voltage supply to cell plate electrode line CP is controlled based on the faulty address, which is programmed in advance.

Figure 7:
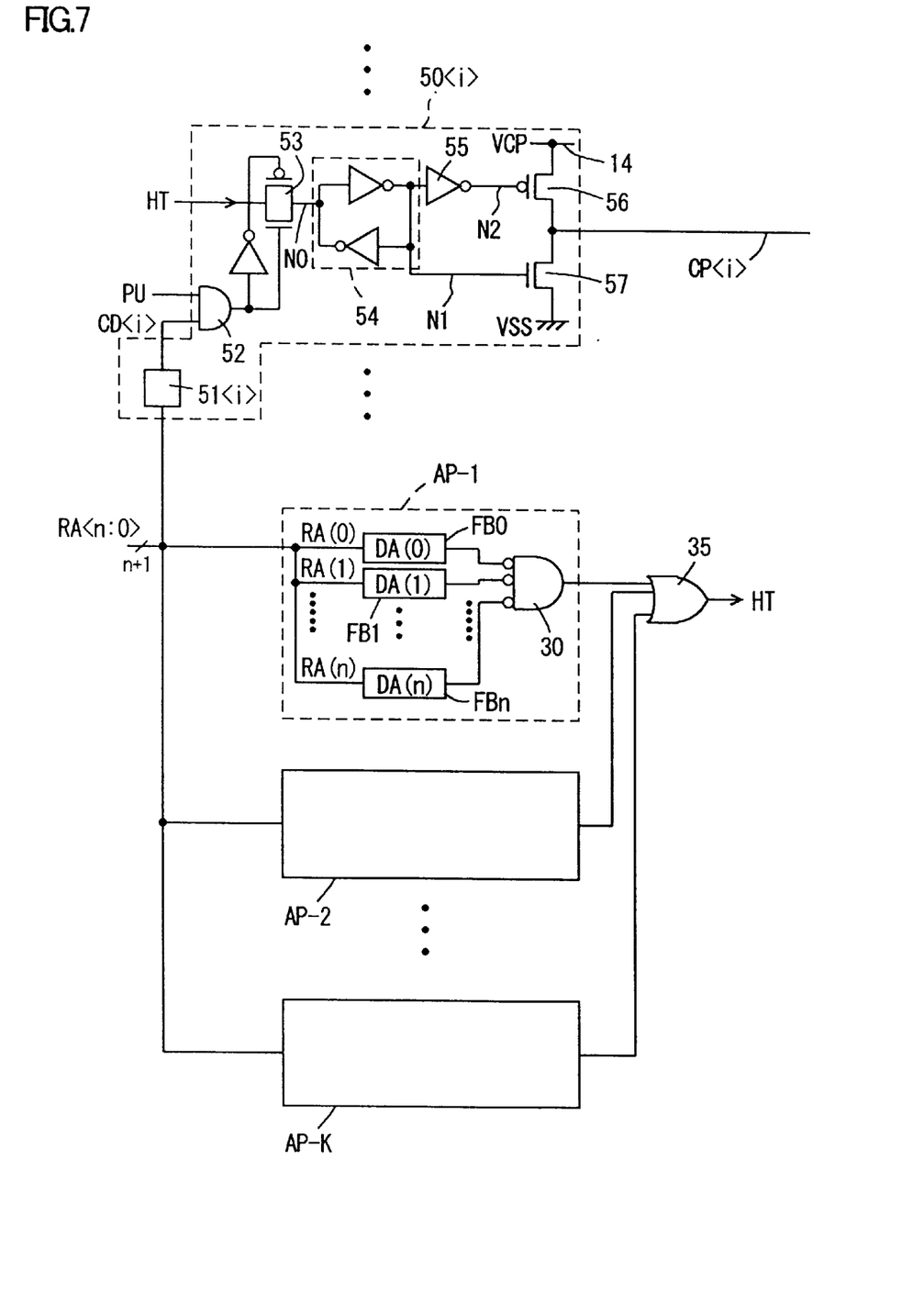
FIG. 7 schematically shows an example of a power supply structure for a cell plate electrode line according to a second embodiment of the invention.

Referring to FIG. 7, it is assumed that the faulty address is represented by (n+1) bits (n: natural number). In this embodiment, as already described, the redundant replacement unit for the faulty row corresponds to the integral multiple of the cell plate electrode lines. Therefore, (n+1) bits representing the faulty address can be smaller in number than the address bits, which are used for selecting the word line.

For example, the redundant replacement unit may be formed for each cell plate electrode line, and thus for the two word lines, as is done in the structure shown in FIG. 5. In the case, the bits representing the faulty address can be smaller by one bit than the address bits used for executing the word line selection. Alternatively, the redundant replacement unit may be formed for the two cell plate electrode lines and thus for the four sub-word lines, as is done in the structure shown in FIG. 6. In this case, the bits representing the faulty address may be smaller by two bits than the address bits used for executing the word line selection.

The structure according to the second embodiment is further provided with address determining circuits AP-1-AP-K (K: natural number), which store different faulty addresses, respectively, and make comparison between portions of the address bits RA<n:0>(RA(n)–RA(0)) required for designating the respective redundant replacement units among the address signals and the stored faulty address for determining the matching.

Each address determining circuit has the same structure, and therefore description will now be representatively given on the structure of address determining circuit AP-1.

Address determining circuit AP-1 has fuse boxes FB0–FBn and a logic gate 30.

Fuse boxes FB0–FBn store faulty address bits DA(0)–DA(n) forming the faulty address of (n+1) bits. Each of fuse boxes FB0–FBn makes comparison between the faulty address bit stored therein and the corresponding address bit for determining whether these match with each other or not. For example, fuse box FB0 compares faulty address bit DA(0) with address bit RA(0) to determine whether these match with each other or not. Fuse box FB0 outputs an L-level signal if matched, and outputs an H-level signal if not matched. Other fuse boxes FB1–FBn operate in a similar manner.

Accordingly, if address bit RA<n:0> matches with the faulty address stored in address determining circuit AP-1, logic gate 30 outputs the H-level signal. If address bit RA<n:0> does not match with the faulty address, logic gate 30 outputs the L-level signal.

Since address determining circuits AP-1-AP-K store different faulty addresses, respectively, the faulty addresses of K in total number can be stored in address determining circuits AP-1-AP-K. Address determining circuits AP-2-AP-K operate similarly to address determining circuit AP-1.

A logic gate 35 outputs, as a match determination signal HT, a result of logical OR between the output signals of address determining circuits AP-1-AP-K. Therefore, match determination signal HT is activated to attain H-level when address bit RA<n:0> matches with any one of the faulty addresses stored in respective address determining circuits AP-1-AP-K. When address bit RA<n:0> matches with none of the faulty addresses, match determination signal HT is inactivated to attain L-level.

FIG. 7 shows a structure, in which the cell plate electrode lines corresponds to the respective redundant repair units, similarly to the structure shown in FIG. 5. Accordingly, address bit RA<n:0> designates one of cell plate electrode lines CP, which are disposed over the whole memory array.

In the structure according to the second embodiment, a cell plate power supply control circuit is provided for each redundant replacement unit instead of program element 20 shown in FIGS. 5 and 6. In the example of the structure shown in FIG. 7, the cell plate power supply control circuit is arranged for each cell plate electrode line. FIG. 7 shows, as a typical example, a structure of a cell plate power supply control circuit 50<i> corresponding to cell plate electrode line CP<i>, which is the redundant replacement unit in the ith position (i: natural number).

Cell plate power supply control circuit 50<i> includes a decode circuit 51<i>, a logic gate 52, a transfer gate 53, a latch circuit 54, an inverter 55, a P-channel MOS transistor 56 and an n-channel MOS transistor 57.

Decode circuit 51<i> sets decode signal CD<i> to H-level when address bit RA<n:0> indicates corresponding cell plate electrode line CP<i>. Logic gate 52 outputs a result of logical AND between decode signal CD<i> sent from decode circuit 51<i> and control signal PU. Control signal PU is activated to H-level for a predetermined period after the power-on.

Meanwhile, address bit RA<n:0> is automatically counted up by a refresh counter (not shown) or the like, and is successively renewed for the active period of control signal PU.

Accordingly, decode signal CD<i> is set to H-level in accordance with the timing for indicating corresponding cell plate electrode lines CP<i> by respective address bits RA<n:0>, which are successively renewed.

Transfer gate 53 is turned on to transmit match determination signal HT to a node NO while the output of logic gate 52 is at H-level. More specifically, match determination signal HT at the on timing of transfer gate 53 indicates whether corresponding cell plate electrode line CP<i> (i.e., redundant replacement unit) is programmed as the faulty address, and thus is the target of replacement, or not.

Latch circuit 54 holds match determination signal HT, which was transmitted in response to turn-on of transfer gate 53 at the time of power-on, and its inverted signal on nodes N0 and N1, respectively. Inverter 55 inverts the signal level held on node N1, and outputs the inverted level to a node N2.

When the predetermined period elapses after the power-on, control signal PU is inactivated. Thereby, transfer gate 53 is maintained at the off state so that contents held in latch circuit 54 do not change.

P-channel MOS transistor 56 is electrically coupled between cell plate voltage line 14 and cell plate electrode line CP<i>, and the gate thereof is coupled to node N2. Therefore, transistor 56 operates as a power supply switch, which is turned on/off in response to match determination signal HT held by latch circuit 54.

N-channel MOS transistor 57 is electrically coupled between ground voltage VSS, which corresponds to the voltage on word line WL in the inactive state, and cell plate electrode line CP<i>, and has a gate coupled to node N1. Therefore, transistor 57 operates as a power supply switch, which is turned on complementarily with transistor 56 in response to match determination signal HT held by latch circuit 54.

Owing to the above structure, when match determination signal HT corresponding to cell plate electrode line CP<i> is set to H-level, and thus corresponding fault replacement unit is designated as the target of replacement, N-channel MOS transistor 57 is turned on, and P-channel MOS transistor 56 is turned off. Since latch circuit 54 latches the voltage level on node N1 while the power is on, supply of cell plate voltage VCP to cell plate electrode line CP<i> stops, and the voltage level thereon is set to ground voltage VSS. Therefore, even if a short-circuited path is present between cell plate electrode line CP<i> and the faulty word line, which is maintained inactive (at ground voltage VSS), the leak current does not flow.

If corresponding match determination signal HT is at L-level, and thus cell plate electrode line CP<i> is not designated as the replacement target, P-channel MOS transistor 56 is turned on, and N-channel MOS transistor 57 is turned off. Therefore, cell plate electrode line CP<i> is supplied with cell plate voltage VCP from cell plate voltage line 14. Thereby, the normal memory operation can be performed.

Owing to the above structure, the address determining circuit, which is required for the redundant replacement repair, can be commonly used for controlling the supply of cell plate voltage VCP to cell plate electrode line CP. Thus, an effect similar to that by the first embodiment can be achieved without especially providing the program element for cutting off the power to the cell plate electrode line.

Further, the program element (fuse) can be used only for programming of the faulty address. This allows concentrated arrangement and others, and improves the flexibility in layout design.

During the predetermined period starting from the power-on, it is determined whether each cell plate electrode line CP is included in the replacement targets or not, and the power supply to cell plate electrode line CP is executed in a fixed manner during the subsequent power-on period. Therefore, these operations do not adversely affect the normal memory operation.

Third Embodiment

In a third embodiment, a power supply structure is configured to execute effectively a burn-in test for cell plate electrode line CP.

In general, the burn-in test in the semiconductor memory device is executed on a wafer, and thus before assembly of chips, and the purpose thereof is to detect a faulty portion hiding in the insulating film or the like by accelerating the degradation thereof.

In the burn-in test, all the word lines are simultaneously selected, or alternate word lines forming a striped pattern are simultaneously selected. Then, a voltage is externally applied to bit line BL or cell plate electrode line CP so that stress voltages are applied to the gate oxide films of the memory cell transistors, the insulating films between the neighboring word lines and the insulating films between the neighboring memory cells for making the hidden fault noticeable.

In the semiconductor memory device according to the embodiment of the invention, as already described, cell plate electrode line CP is formed at the same interconnection layer neighboring to word line WL. Therefore, it becomes necessary to perform screening of a fault hiding in the insulating film between the cell plate electrode line CP and word line WL.

Figure 8:
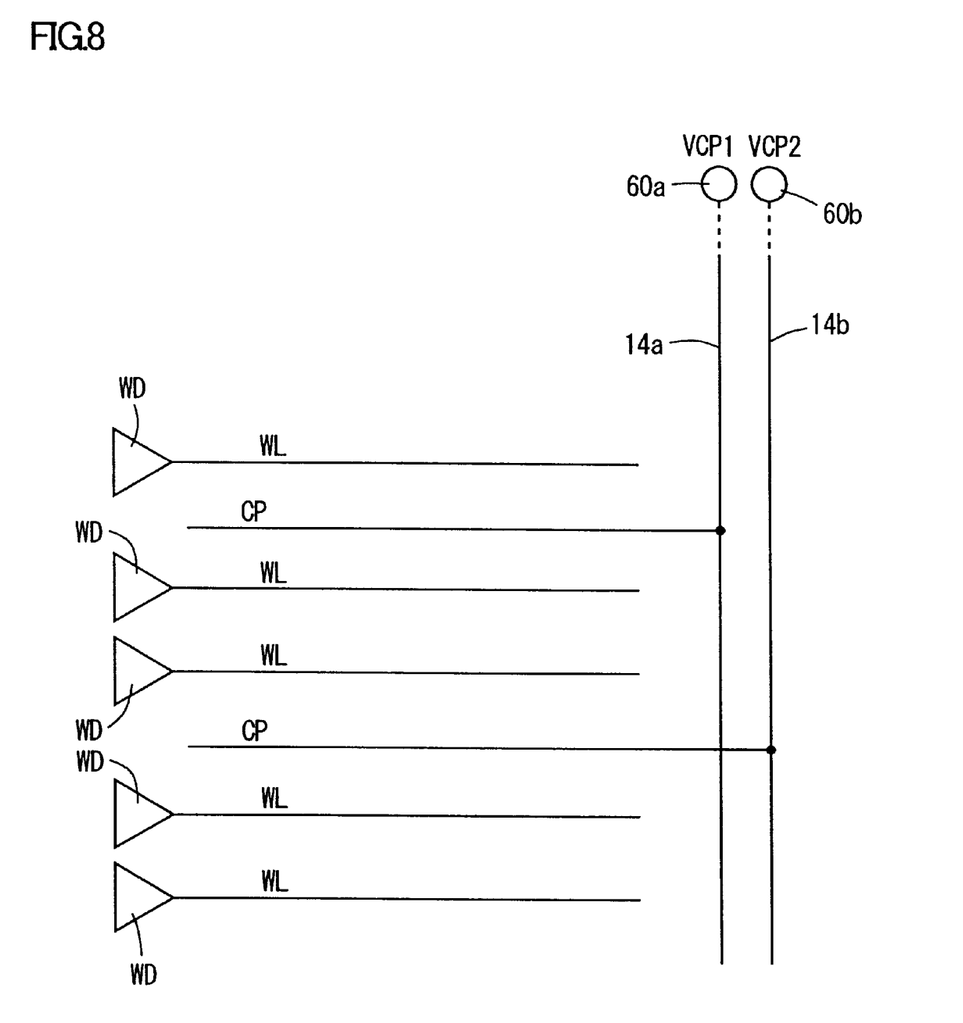
FIG. 8 schematically shows an example of a power supply structure for a cell plate electrode line according to a third embodiment of the invention.

Referring to FIG. 8, a structure for supplying the power to the cell plate electrode line according to the third embodiment includes a plurality of cell plate voltage lines, which can be externally supplied with independent voltages during the operation of the device, and supply the voltages to respective cell plate electrode lines CP, respectively.

For example, the structure is provided with two cell plate voltage lines 14a and 14b. Cell plate electrode line CP is supplied with the cell plate voltage from one of cell plate voltage lines 14a and 14b.

In the burn-in test, cell plate voltage levels 14a and 14b are electrically coupled to external pads 60a and 60b, respectively. In the burn-in test, external pads 60a and 60b can be supplied with cell plate voltages VCP1 and VCP2 for test, which are independent from each other.

In the wafer burn-in test, therefore, an arbitrary voltage can be applied to cell plate electrode line CP for executing the burn-in test.

Cell plate electrode lines CP are alternately connected to different kinds of cell plate voltage lines 14a and 14b so that the wafer burn-in test can be executed in such a manner that the cell plate voltage for the test is applied in a striped pattern to word lines WL and cell plate electrode lines CP.

Owing to the above structure, the burn-in test can be effectively executed to remove a hidden fault even in the semiconductor memory device according to the invention, which is characterized in that cell plate electrode line CP and word line WL are formed at the same interconnection layer.

Although not shown in FIG. 8, the power supply structure according to the first or second embodiment may be arranged between each cell plate electrode line CP and cell plate voltage line 14a or 14b. For increasing the kinds of the cell plate voltages, which can be applied in the burn-in test, three or more cell plate voltage lines, which can apply independent voltages, respectively, may be appropriately employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arranged in rows and columns, each of said plurality of memory cells including a capacitor having a cell plate electrode receiving a reference voltage and a storage electrode for accumulating charges corresponding to storage information;

a plurality of word lines arranged corresponding to the plurality of rows of said memory cells, respectively, and each connected to the memory cells in the corresponding row;

a row select circuit for setting each of said plurality of word lines to one of voltages corresponding to an active state and an inactive state, respectively, in accordance with an address signal;

a plurality of bit lines arranged corresponding to the plurality of columns of said memory cells, respectively, and each connected to the memory cells in the corresponding column;

a plurality of cell plate electrode lines formed at the same interconnection layer as said plurality of word lines, each of said cell plate electrode lines being arranged for a predetermined number of rows, and being commonly used as said cell plate electrode by the plurality of memory cells corresponding to said predetermined number of rows;

a cell plate voltage line for supplying said reference voltage; and a plurality of power-off control portions each arranged for the cell plate electrode lines of N (N: natural number) in number corresponding to a redundant replacement unit for a faulty row for stopping supply of said reference voltage from said cell plate voltage line to the corresponding N cell plate electrode lines in accordance with an instruction.

2. The semiconductor memory device according to claim 1, wherein each of said power-off control portions includes a program element electrically coupled between said cell plate voltage line and said corresponding N cell plate electrode lines, and said program element nonvolatilely changes from an on state to an off state in response to said instruction supplied when the corresponding redundant replacement unit contains said faulty row.

3. The semiconductor memory device according to claim 2, wherein said program element is formed of a fuse element.

4. The semiconductor memory device according to claim 1, wherein

N is equal to one, and said redundant replacement unit is formed of at least one row corresponding to the same cell plate electrode line.

5. The semiconductor memory device according to claim 1, wherein said plurality of word lines include:

sub-word lines arranged for said rows, respectively, and main word lines each provided for the rows of M (M: integer larger than one) in number and arranged hierarchically with respect to said sub-word line; and said rows corresponding to the cell plate electrode lines of N in number belonging to the same redundant replacement unit are related to the same main word line.

6. The semiconductor memory device according to claim 1, wherein each of said power-off control portions includes:
- a latch circuit for holding a control signal indicating whether the corresponding redundant replacement unit contains said faulty row or not, and
- a first power supply switch electrically coupled between said cell plate voltage line and the corresponding N cell plate electrode lines for being turned on/off in response to the control signal held in said latch circuit.

7. The semiconductor memory device according to claim 6, wherein each of said power-off control portions includes a second power supply switch electrically coupled between the voltage corresponding to said inactive state of each of said word lines and the N cell plate electrode lines for being turned on complementarily with said first power supply switch in response to the control signal held in said latch circuit.

8. The semiconductor memory device according to claim 6, further comprising:

an address determining circuit for storing an faulty address indicating the redundant replacement unit including said faulty row, and successively producing said control signal for each of said redundant replacement units based on comparison between each of the successively renewed address signals and said faulty address, wherein each of said power-off control portions further includes a gate circuit for transmitting said control signal received from said address determining circuit to said latch circuit when said successively renewed address signal indicates the corresponding redundant replacement unit, and said latch circuit holds the control signal transmitted by said gate circuit during the power-on state.

9. The semiconductor memory device according to claim 1, wherein said cell plate voltage line includes a plurality of interconnections capable of externally receiving independent voltages, respectively, during an operation test.

10. The semiconductor memory device according to claim 1, wherein said cell plate voltage line includes two interconnections capable of externally receiving independent voltages, respectively, during an operation test and the neighboring two lines among said plurality of cell plate voltage lines are connected to said two interconnections via the corresponding power-off control portions.

* * * * *